(12) United States Patent
Nakamura et al.

(10) Patent No.: US 6,829,490 B2
(45) Date of Patent: Dec. 7, 2004

(54) FOLDING ELECTRONIC APPARATUS AND FLEXIBLE SUBSTRATE THEREOF

(75) Inventors: Yutaka Nakamura, Kokubunji (JP); Akira Iizuka, Hino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 410 days.

(21) Appl. No.: 10/133,397

(22) Filed: Apr. 29, 2002

(65) Prior Publication Data

US 2002/0187803 A1 Dec. 12, 2002

(30) Foreign Application Priority Data

Jun. 6, 2001 (JP) ........................................ 2001-171599

(51) Int. Cl.⁷ ................................................. H04M 1/00
(52) U.S. Cl. ................ 455/550.1; 455/90.3; 455/556.1; 455/556.2; 455/575.3; 455/575.4; 455/575.1; 379/433.05; 379/426; 379/433.12; 379/433.13; 379/428.01
(58) Field of Search ............................ 455/550.1, 90.3, 455/556.1, 556.2, 575.3, 575.4, 575.1; 379/434, 433.12, 433.13, 433.11, 429, 433.05, 455, 425, 426, 428.01

(56) References Cited

U.S. PATENT DOCUMENTS

| | | | | |
|---|---|---|---|---|
| 5,513,383 A | * | 4/1996 | Tsao ........................ | 455/575.7 |
| 5,809,403 A | * | 9/1998 | MacDonald et al. ...... | 455/575.7 |
| 6,011,699 A | * | 1/2000 | Murray et al. .............. | 361/814 |
| 6,146,190 A | * | 11/2000 | Fuerst et al. ................ | 439/496 |
| 6,301,489 B1 | * | 10/2001 | Winstead et al. ......... | 455/575.7 |
| 6,461,193 B1 | * | 10/2002 | Matthies ..................... | 439/509 |
| 6,483,719 B1 | * | 11/2002 | Bachman .................... | 361/816 |
| 6,625,471 B2 | * | 9/2003 | Mori et al. .................. | 455/557 |

FOREIGN PATENT DOCUMENTS

JP 2821333 8/1998

* cited by examiner

Primary Examiner—Marceau Milord
(74) Attorney, Agent, or Firm—Finnegan, Henderson, Farabow, Garrett & Dunner, L.L.P.

(57) ABSTRACT

A folding electronic apparatus invention comprises a flexible substrate where a first belt-like part and a second belt-like part are connected by a middle part so as to form a crank shape. At least one of the first belt-like part and the second belt-like part of the flexible substrate is rolled with the middle part as an axis to form a roll buffer part. The roll buffer part is housed in the hollow of a hinge axis. A tips of the first and second belt-like parts are pulled into a first and second units through an opening in the hinge axis and then connected to the first and second circuits in the first and second units.

14 Claims, 4 Drawing Sheets

FOLDING ELECTRONIC APPARATUS AND FLEXIBLE SUBSTRATE THEREOF

CROSS-REFERENCE TO RELATED APPLICATIONS

This application is based upon and claims the benefit of priority from the prior Japanese Patent Application No. 2001-171599, filed Jun. 6, 2001, the entire contents of which are incorporated herein by reference.

BACKGROUND OF THE INVENTION

1. Field of the Invention

This invention relates to an electronic apparatus, such as a mobile phone, PDA (Personal Digital Assistant), or an electronic organizer, and more particularly to a folding electronic apparatus.

2. Description of the Related Art

A folding mobile phone is such that, for example, a first unit provided with a speaker, a display unit, and others is connected with a second unit provided with a microphone, a keypad, and others via a hinge unit in such a manner that they can rotate. This type of mobile phone is folded up small in the standby state in such a manner that the first and second units are laid on top of the other, thereby providing a good portability. On the other hand, when starting to communicate, the user unfolds the first and second units, thereby securing a high operability and a good visibility.

In this type of mobile phone, a flexible substrate is used to electrically connect the circuit provided in the first unit to the circuit provided in the second unit.

FIG. 5 shows the configuration of a mobile phone written in Jpn. Pat. Appln. KOKOKU Publication No. 2821333. In this mobile phone, the front case 1-1 of the first unit 1, the front case 2-1 of the second unit 2, the rear cover 1-2 of the first unit 1, the rear cover 2-2 of the second unit are provided with arc-like curved surface parts 1-3, 1-4, 2-3, 2-4, respectively. These curved surface parts 1-3, 1-4 and 2-3, 2-4 are jointed with one another, thereby constituting a cylindrical axis member. This axis member makes a hinge 3. The circuit in the first unit 1 is connected to the circuit in the second unit 2 by a flexible substrate 4. The flexible substrate 4 is in the form of a belt. The flexible substrate 4 is rolled spirally once in the cylinder of the hinge 3 along its inside diameter, with both ends of the substrate 4 pulled into the inside of the first and second units 1 and 2. At both ends of the flexible substrate 4, connectors are provided. The connectors are connected to the circuits in the first and second units 1 and 2. With this configuration, the tension exerted on the flexible substrate 4 or the slack exerted on the substrate 4 at the time of opening and closing the units 1 and 2 can be absorbed inside the hinge 3.

With such a conventional configuration, however, the flexible substrate 4 is rolled spirally. Accordingly, the flexible substrate 4 rubs against itself complicatedly, with the result that the flexible substrate 4 tends to deteriorate. Above all, it is impossible to avoid the rubbing of both the side edges of the flexible substrate 4 against one another. As a result, there is a danger that the wiring patterns near both the edges of the substrate 4 will come off or break.

In recent years, double-sided flexible substrates which have wiring patterns formed on both sides of a single substrate and multilayer flexible substrates formed by laying a plurality of substrates one on top of another have been widely used. This type of flexible substrate, however, generally has a poor flexibility. Therefore, if these flexible substrates were used in folding mobile phones, the substrates would be more liable to deteriorate, resulting in a decrease in the reliability of the mobile phones.

BRIEF SUMMARY OF THE INVENTION

The object of the present invention is to provide not only a folding electronic apparatus which decreases the deterioration of its flexible substrate and thereby improves the reliability of the apparatus but also the flexible substrate.

According to an aspect of the present invention, a crank-shaped flexible substrate is used. The flexible substrate is composed of a first belt-like part, a second belt-like part, and a middle part which connects the first and second belt-like parts so as to form a crank shape. At least one of the first belt-like part and the second belt-like part is rolled with the middle part as an axis to form a roll buffer part. The roll buffer part is housed in a cylindrical axis member of a hinge unit. In this state, a tips of the first and second belt-like parts are pulled into the first and second units through an opening made in the side face of the cylindrical axis member. Then, the tips of the pulled-in first and second belt-like parts are connected to a circuits provided in the first and second units respectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
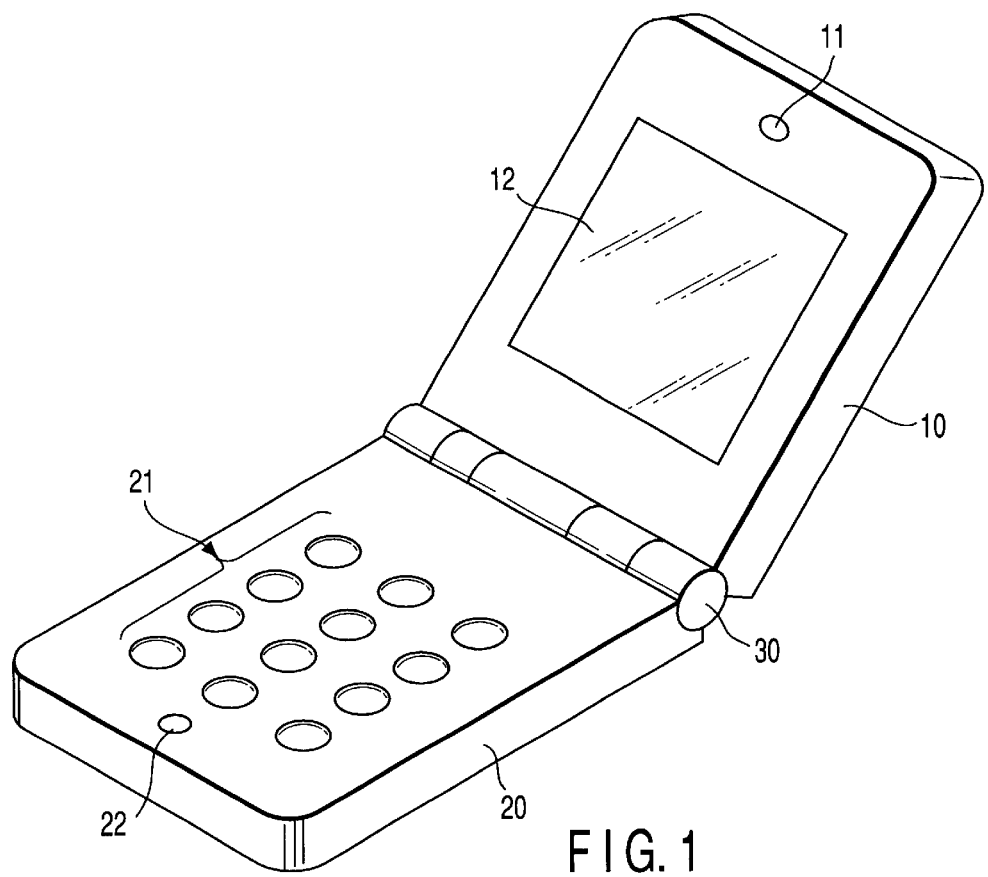
FIG. 1 is a perspective view showing the outward appearance of a mobile phone, a first embodiment of a folding electronic apparatus related to the present invention.
Figure 5:
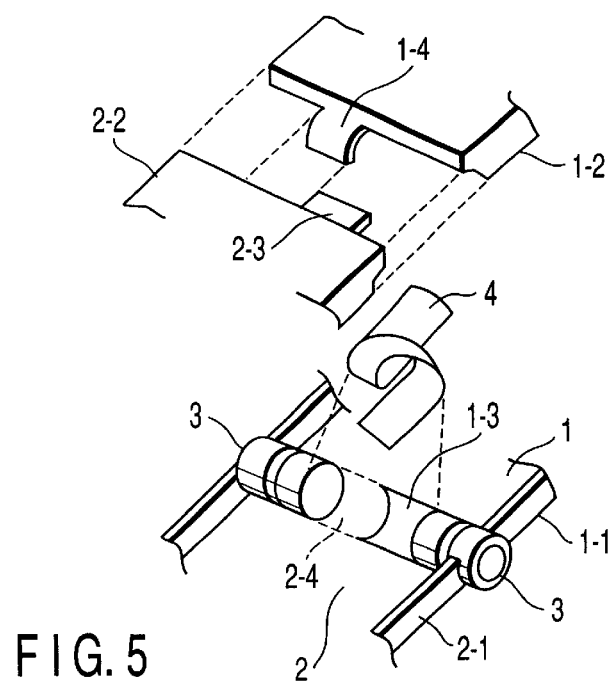
FIG. 5 is a perspective view showing the configuration of the main part of a mobile phone using a conventional flexible substrate.

FIG. 1 is a perspective view showing the outward appearance of a mobile phone, a first embodiment of a folding electronic apparatus related to the present invention.

The folding mobile phone is such that a first unit 10 is coupled with a second unit 20 in such a manner that they can rotate freely couples a hinge unit 30. The first unit 10 is provided with a speaker 11 and a display unit 12. The display unit 12 is composed of, for example, an LCD (Liquid Crystal Display). The display unit 12 displays not only transmitted and received messages but also a telephone directory stored in the memory of the mobile phone, management information including the history of transmission and reception, and the operating state of the mobile phone, including the remaining charge of the battery and the reception field strength. The second unit 20 is provided with a microphone 21 and a keypad 22. The keypad 22 has dial keys and a plurality of function keys. These keys are used to enter the telephone number of the called party, mail addresses, transmitted massages, and others.

In the folding mobile phone, a flexible substrate 40 is used to connect the circuit provided in the first unit 10 to the circuit provided in the second unit 20.

Figures 2A, 2B, 2C:
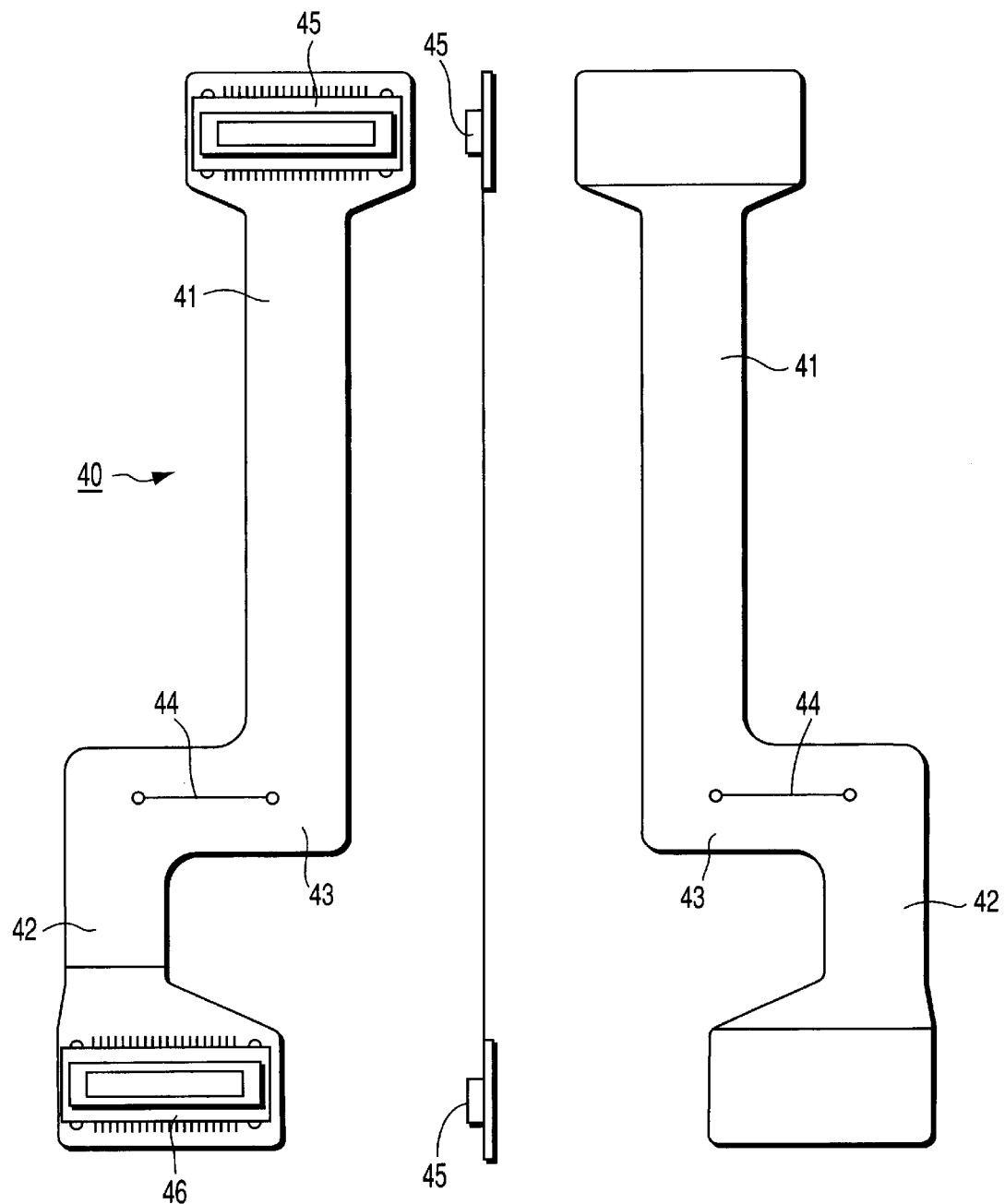
FIGS. 2A, 2B, and 2C are a front view, a side view, and a back view showing the structure of a flexible substrate related to the first embodiment.

FIGS. 2A, 2B and 2C shows the structure of the flexible substrate 40. FIG. 2A is a front view of the substrate 40. FIG. 2B is a side view of the substrate 40. FIG. 2C is a back view of the substrate 40. The flexible substrate 40 is such that a first belt-like part 41 is connected with a second belt-like part 42 via a middle part 43 so as to form a crank shape. On one side or both sides of the flexible substrate 40, a plurality of wiring patterns (not shown) have been formed.

At the ends of the first and second belt-like parts 41, 42, connectors 45, 46 are provided, respectively. Each of these connectors 45, 46 has a plurality of terminals, which are connected to the wiring patterns. The connectors 45, 46 are connected to the connector in the first unit 10 and that in the second unit 20, respectively. In the central part of the middle part 43, a cut 44 has been made in the longitudinal direction. The cut 44 determines a bending position or a curving center position in the middle part 43.

Figure 3:
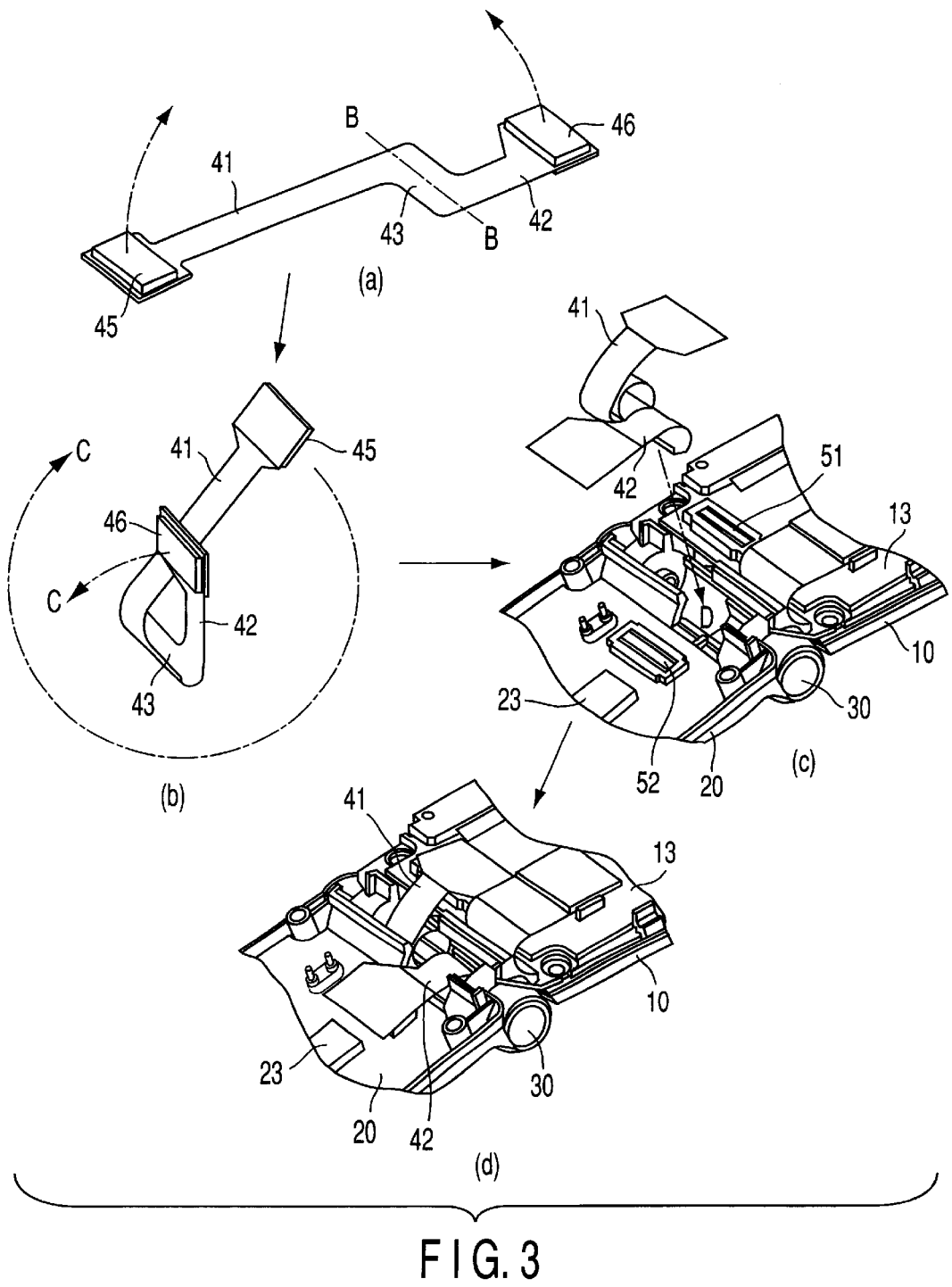
FIG. 3 is a perspective view showing the configuration of the main part of the mobile phone using the flexible substrate of FIG. 2.

The flexible substrate 40 is used as follows. FIG. 3 is a perspective view showing the procedure for connecting the flexible substrate 40 and its structure.

First, the middle part 43 of the flexible substrate 40 is bent into a V shape, centering on an inward bending position B—B as shown in (a) of FIG. 3, thereby bringing the substrate 40 into the state shown in (b) of FIG. 3. At this time, the bending is effected easily and accurately, because the cut 44 has been made in the middle part 43 as shown in FIG. 2. This prevents the wiring patterns on the flexible substrate 40 from being damaged as a result of the bending.

Then, using the middle part 43 bent into a V shape as an axis, the first and second belt-like parts 41, 42 are rolled in opposite directions as shown by C, C' of FIG. 3, respectively. At this time, each of the first and second belt-like parts 41 and 42 is rolled so as to lie on top of the same circumferential surface in order with almost the same width being kept. That is, the belt-like parts 41, 42 are rolled in such a manner that they do not take the form of a spiral. The number of rolls is set to at least one, preferably to two. The rolling of the first and second belt-like parts 41, 42 produces first and second independent roll buffers.

Next, each roll buffer part of the flexible substrate 40 is housed in the hollow of the cylindrical hinge unit 30 as shown by D in (c) of FIG. 3. The outside diameter of the first and second roll buffer parts is set so as to be smaller than the inside diameter of the axis of the hinge unit 30.

Then, the tip portions of the first and second belt-like parts 41, 42 are pulled into the first and second units 10, 20 through an opening made in the side face of the hollow of the hinge unit 30. Then, connectors 45, 46 attached to the tip portions are connected to the connectors 51, 52 of the circuits 13, 23 provided in the first and second units 10, 20. This completes the circuit connection between the first and second units 10, 20 by the flexible substrate 40.

After the connection has been completed, rear covers (not shown) are fitted on the front cases of the first and second units 10, 20. As a result, the hollow of the hinge unit 30 is closed with the semicircular parts of the rear covers, thereby forming the axis of the hinge unit 30. Thereafter, each roll buffer part of the flexible substrate 40 is held in the axis in such a manner that the first and second belt-like parts 41, 42 can be pulled out and rewound freely.

With the mobile phone configured as described above, when the first and second units 10, 20 in the closed state are opened, the first and second belt-like parts 41, 42 of the flexible substrate 40 are pulled out a suitable length from the roll housed in the axis of the hinge unit 30 into the units 10, 20 respectively according to the amount of change in the angle at that time. Accordingly, the tension exerted on the flexible substrate 40 and the load applied to the connectors 51, 52 are absorbed.

Conversely, when the first and second units 10, 20 in the open state are closed, the first and second belt-like parts 41, 42 of the flexible substrate 40 are rewound from the units 10, 20 into the roll formed in the axis of the hinge unit 30 according to the amount of change in the angle at that time. This prevents the slack or bend of the flexible substrate 40 from occurring.

Furthermore, in the first embodiment, the flexible substrate 40 has been formed into a crank shape. With the middle part 43 as an axis, each of the first and second belt-like parts 41 and 42 has been rolled so as to lie on top of the same circumferential surface in order with almost the same width being kept, thereby forming two independent roll buffer parts. Therefore, even when the first and second belt-like 41, 42 are pulled out or rewound according to the amount of change in the angle resulting from the opening and closing of the first and second units, the direction of their movement is limited to the longitudinal direction of the belt-like parts 41, 42. That is, the pulling-out and rewinding movements of the first and second belt-like parts 41, 42 are limited only to a one-dimensional direction, which simplifies the movements.

This prevents the flexible substrate 40 from, for example, rubbing against itself complicatedly, and more specifically rubbing its side edges against one another. As a result, the deterioration of the flexible substrate 40 is reduced, which improves the reliability of the mobile phone. This effect is particularly helpful in using a substrate on both sides of which wiring patterns have been formed or a multilayer substrate as the flexible substrate 40.

Furthermore, in the first embodiment, the cut 44 has been made in the middle part 43 of the flexible substrate 40. When the middle part 43 is bent into a V shape to form a roll axis, the cut 44 is used as a bending guide line, which makes the bending of the middle part 43 easy and accurate. This prevents the wiring patterns on the flexible substrate 40 from being damaged as a result of the bending.

(Second Embodiment)

A second embodiment of the present invention is such that, when it is necessary to wire a coaxial cable for transmitting, for example, a radio frequency signal between the first and second units, the coaxial cable is wired through the roll of the flexible substrate described in the first embodiment.

Figure 4:
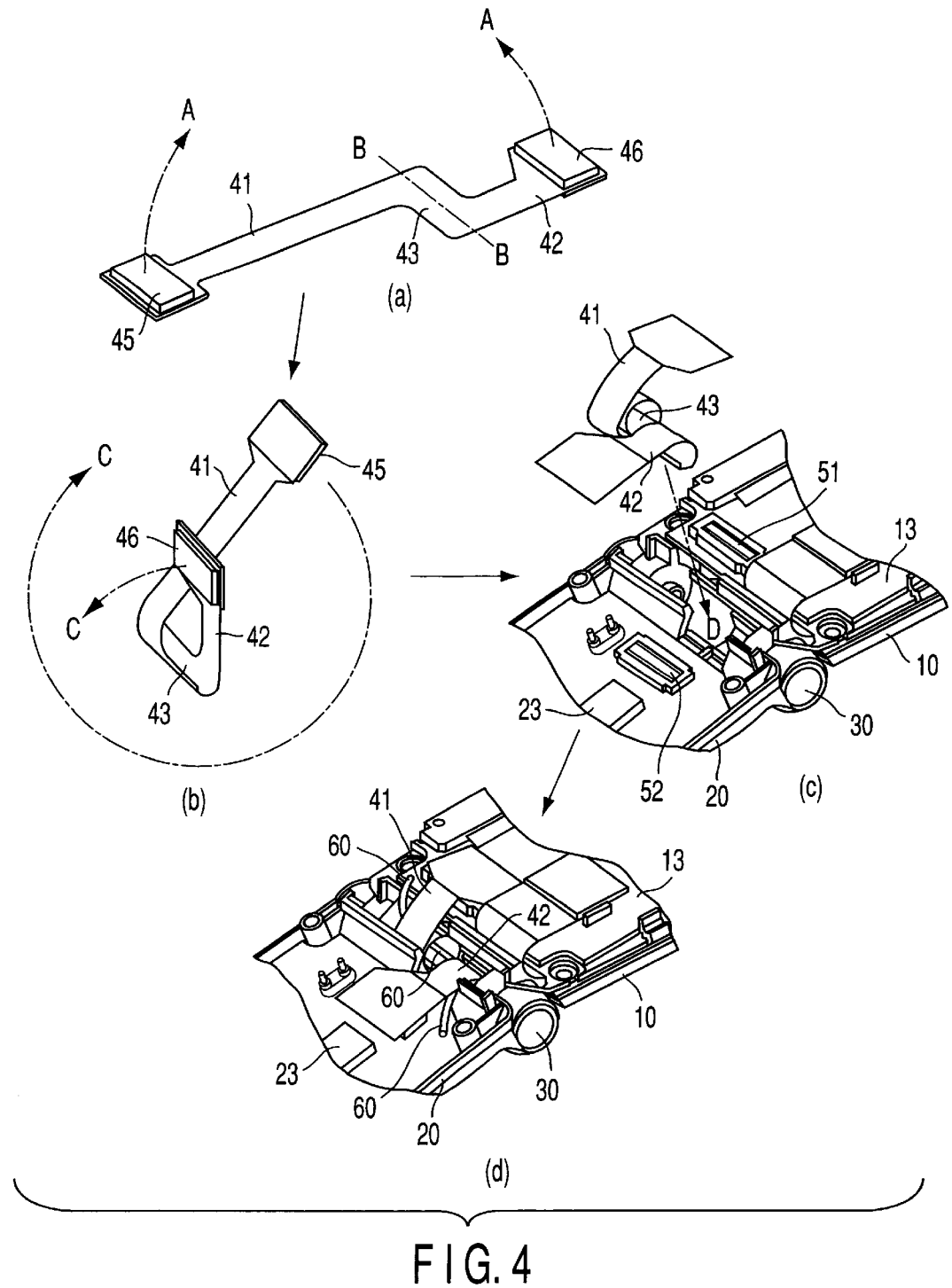
FIG. 4 is a perspective view showing the configuration of the main part of a mobile phone according to a second embodiment of the present invention.

FIG. 4 is a perspective view showing the configuration of the main part of a folding mobile phone according to a second embodiment of the present invention. In FIG. 4, the same parts as those in FIG. 3 are indicated by the same reference numerals and a detailed explanation of them will be omitted.

In (d) of FIG. 4, a coaxial cable 60 extends from the inside of the first unit 10, passes by the side of the first belt-like part 41 of the flexible substrate 40, and is directed into the roll. After passing through the roll of the first belt-like part 41, the coaxial cable 60 is directed along the middle part 43 into the roll of the second belt-like part 42. Then, the coaxial cable 60 is pulled out of the outer side of the roll of the second belt-like part 42 and then is directed into the second unit 20.

With this configuration, the coaxial cable 60 is wired in a crank inside the roll formed by the flexible substrate 40, which enables wiring to be done smoothly without impeding the wiring of the flexible substrate 40.

(Other Embodiments)

While in the first embodiment, the first and second belt-like parts 41, 42 have been rolled the same number of times, the number of rolls of the first belt-like part 41 may differ from that of the second belt-like part 42. In that case, the longer one of the first and second belt-like parts 41, 42 should be rolled more times.

Furthermore, in the first embodiment, both of the first and second belt-like parts 41, 42 have been rolled to form two independent roll buffer parts. Either the first belt-like part 41 or the second belt-like part 42 may be rolled to form one roll buffer part.

In the second embodiment, the coaxial cable 60 has been bent into a crank and passed in the roll of the flexible substrate 40. The coaxial cable 60 may be rolled at least once into a coil in the roll. This prevents the cable 60 from twisting when the first and second units 10, 20 are opened and closed, which reduces the deterioration of the coaxial cable 60.

Furthermore, the flexible substrate 40 may be made of, for example, a material with less friction. Alternatively, the surface of the flexible substrate 40 may be subjected to the process or treatment of reducing friction. This enables the first and second belt-like parts 41, 42 to be pulled out and rewound more smoothly.

Moreover, in the second embodiment, use of a coaxial cable for transmitting a radio signal between the first and second units has been explained. In addition to this, an earth cable may be wired which connects the earth pattern of the first circuit and the earth pattern of the second circuit. The earth cable may connect the earth terminals of the connectors 45, 46 provided at both ends of the flexible substrate. This makes it possible to secure a sufficient earth capacity by using the earth cable, even when a sufficient earth capacity cannot be secured only with the earth pattern formed on the flexible substrate.

Furthermore, in the first and second embodiments, a folding electronic apparatus has been explained, taking a folding mobile phone as an example. The present invention is not limited to this and may be applied to the connection between a notebook personal computer and an electronic organizer, the connection between the display unit of an electronic dictionary and a keyboard unit, and the connection between the body unit of a video camera and a display unit.

Still furthermore, while in the first and second embodiments, the flexible cable has been formed into a crank shape, it may be formed into a U shape. As for the configuration and shape of the flexible substrate, the type and configuration of the electronic apparatus, the structure of the hinge unit, and others, this invention may, of course, be practiced or embodied in still other ways without departing from the spirit or essential character thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mobile communication terminal comprising:
    a first unit with a first circuit;
    a second unit with a second circuit;
    a hinge unit which couples said first unit and said second unit in such a manner that they can rotate and which has a cylindrical axis member whose side face has an openings that leads to the inside of said first unit and to the inside of said second unit; and
    a flexible substrate which connects the first circuit and the second circuit and which has such a structure as connects a first belt-like part and a second belt-like part by a middle part so as to form a crank shape, either the first belt-like part or the second belt-like part being rolled with the middle part as an axis to form a roll buffer part, the roll buffer part being housed in the cylindrical axis member of said hinge unit, and a tips of the first and second belt-like parts being pulled into said first and second units through the opening in the cylindrical axis member and connected to the first and second circuits.

2. The mobile communication terminal according to claim 1, wherein
    said flexible substrate has a cut for bending the middle part into a V shape in the middle part.

3. The mobile communication terminal according to claim 1, further comprising:
    a wire cable which connects the first circuit and the second circuit and is passed into the roll buffer part of said flexible substrate.

4. The mobile communication terminal according to claim 3, wherein said wire cable is a coaxial cable which transmits a radio signal between the first circuit and the second circuit.

5. The mobile communication terminal according to claim 3, wherein said wire cable is an earth cable which connects an earth pattern in the first circuit and an earth pattern in the second circuit.

6. A mobile communication terminal comprising:
    a first unit with a first circuit;
    a second unit with a second circuit;
    a hinge unit which couples said first unit and said second unit in such a manner that they can rotate and which has a cylindrical axis member whose side face has an openings that leads to the inside of said first unit and to the inside of said second unit; and
    a flexible substrate which connects said first circuit and said second circuit and which has such a structure as connects a first belt-like part and a second belt-like part by a middle part so as to form a crank shape, each of the first and second belt-like parts being rolled with the middle part as an axis to form a first and a second roll buffer part, the first and second roll buffer parts being housed in the cylindrical axis member of said hinge unit, and a tips of the first and second belt-like parts being pulled into said first and second units through the opening in the cylindrical axis member and connected to the first and second circuits.

7. The mobile communication terminal according to claim 6, wherein
said flexible substrate has a cut for bending the middle part into a V shape in the middle part.

8. The mobile communication terminal according to claim 6, further comprising:
a wire cable which connects the first circuit and the second circuit and is passed into the first and second roll buffer parts of said flexible substrate.

9. The mobile communication terminal according to claim 8, wherein said wire cable is a coaxial cable which transmits a radio signal between the first circuit and the second circuit.

10. The mobile communication terminal according to claim 8, wherein said wire cable is an earth cable which connects an earth pattern in the first circuit and an earth pattern in the second circuit.

11. A flexible substrate which connects a first unit with a first circuit and a second unit with a second circuit in such a manner that they can rotate by using a hinge unit with a cylindrical axis member which has a hollow in its inside and an opening in its side face, said flexible substrate comprising:
a structure which connects a first belt-like part and a second belt-like part by a middle part so as to form a crank shape, either said first belt-like part or said second belt-like part being rolled with said middle part as an axis to form a roll buffer part, said roll buffer part being housed in the cylindrical axis member of said hinge unit, and a tips of said first and second belt-like parts being pulled into said first and second units through the opening in the cylindrical axis member and connected to the first and second circuits.

12. The flexible substrate according to claim 11, wherein said middle part has a cut for bending the middle part into a V shape.

13. A flexible substrate which connects a first unit with a first circuit and a second unit with a second circuit in such a manner that they can rotate by using a hinge unit with a cylindrical axis member which has a hollow in its inside and an opening in its side face, said flexible substrate comprising:
a structure which connects a first belt-like part and a second belt-like part by a middle part so as to form a crank shape, each of said first belt-like part and said second belt-like part being rolled with said middle part as an axis to form a first and a second roll buffer part, said first and second roll buffer parts being housed in the cylindrical axis member of said hinge unit, and a tips of said first and second belt-like parts being pulled into said first and second units through the opening in the cylindrical axis member and connected to the first and second circuits.

14. The flexible substrate according to claim 13, wherein said middle part has a cut for bending the middle part into a V shape.

* * * * *